(12) United States Patent
Hirano

(10) Patent No.: US 7,211,142 B2
(45) Date of Patent: May 1, 2007

(54) CDTE SINGLE CRYSTAL AND CDTE POLYCRYSTAL, AND METHOD FOR PREPARATION THEREOF

(75) Inventor: Ryuichi Hirano, Kitaibaraki (JP)

(73) Assignee: Nippon Mining & Metals Co., Ltd., Tokyo (JP)

(*) Notice: Subject to any disclaimer, the term of this patent is extended or adjusted under 35 U.S.C. 154(b) by 428 days.

(21) Appl. No.: 10/505,588

(22) PCT Filed: Nov. 29, 2002

(86) PCT No.: PCT/JP02/12486

§ 371 (c)(1),
(2), (4) Date: Aug. 25, 2004

(87) PCT Pub. No.: WO03/078703

PCT Pub. Date: Sep. 25, 2003

(65) Prior Publication Data

US 2005/0170649 A1 Aug. 4, 2005

(30) Foreign Application Priority Data

Mar. 19, 2002 (JP) .............................. 2002-076313

(51) Int. Cl.
*C30B 29/48* (2006.01)
(52) U.S. Cl. .................... 117/81; 117/13; 117/82; 117/83; 117/956
(58) Field of Classification Search ................ 117/13, 117/81, 82, 83, 956
See application file for complete search history.

(56) References Cited

U.S. PATENT DOCUMENTS 3,962,669 A * 6/1976 Entine et al. ............... 338/19
3,999,071 A * 12/1976 Siffert et al. ............ 250/370.02
4,141,777 A * 2/1979 Matveev et al. ............ 117/81

FOREIGN PATENT DOCUMENTS

| EP | 0627506 | * | 3/1994 |
| JP | 02-82573 | * | 3/1990 |
| JP | 3-295899 A | | 12/1991 |
| JP | 4-97992 A | | 3/1992 |
| JP | 5-283729 A | | 10/1993 |
| JP | 5-283729 A | | 10/1993 |
| JP | 07-300587 A | | 11/1995 |
| JP | 2517803 B2 | | 5/1996 |
| JP | 8-259399 A | | 8/1996 |
| JP | 9-124310 A | | 5/1997 |
| JP | 2844430 B2 | | 10/1998 |
| JP | 2000-226300 A | | 8/2000 |
| JP | 2001-335400 A | | 12/2001 |

* cited by examiner

*Primary Examiner*—Robert Kunemund
(74) *Attorney, Agent, or Firm*—Birch, Stewart, Kolasch & Birch, LLP

(57) ABSTRACT

A CdTe single crystal, wherein chlorine concentration in the crystal is between 0.1 and 5.0 ppmwt and resistivity at room temperature is not less than $1.0 \times 10^9$ $\Omega \cdot cm$ is obtained by growing the crystal according to one of a vertical gradient freezing method, a horizontal gradient freezing method, a vertical Bridgman method, a horizontal Bridgman method, and a liquid encapsulated Czochralski method by using a CdTe polycrystal, in which 50 to 200 ppmwt of chlorine is doped, as a raw material.

2 Claims, 3 Drawing Sheets

CDTE SINGLE CRYSTAL AND CDTE POLYCRYSTAL, AND METHOD FOR PREPARATION THEREOF

FIELD OF THE INVENTION

The present invention relates to a Group II–VI compound semiconductor single crystal and a method for producing the same. In particular, the present invention relates to a CdTe system compound semiconductor single crystal having high resistance, which is useful as a substrate for a semiconductor device, such as a radiation detector or the like, and to a CdTe polycrystal which becomes a raw material of the above-described CdTe single crystal, and to a method for producing the same.

BACKGROUND ART

Generally, CdTe single crystals having high purity and high resistance are suitable for substrates for semiconductor devices, such as radiation detector, IC tester and the like. It is known that the higher the resistance of the CdTe single crystal to be used is (for example, not less than $1.0 \times 10^9$ $\Omega \cdot cm$), the more the device characteristic improves.

In earlier technology, for producing a Group II–VI compound semiconductor single crystal, such as CdTe or the like, the THM (traveling heater method) of putting a columnar raw material having the same composition as the growing compound crystal and a material to be a solvent for dissolving the raw material at the time of crystal growth into a growth container in a state that the raw material is placed on the solvent material, heating locally to melt the solvent with a heater and forming a melting zone by also melting the lower end of the raw material, and thereafter, depositing continuously to grow a single crystal from the lower end of the melting zone by moving the heater upward or by moving the growth container downward has been generally used. It is said that the THM makes it possible to grow a Group II–VI compound semiconductor single crystal having high purity and high resistance more than other methods, such as vertical gradient freezing (VGF) method and the like.

Further, in order to make the resistance of a CdTe single crystal high, for example, a method of adding halogen, such as chlorine or the like, in the crystal has been used. However, when the amount of chlorine for adding into the crystal is increased in order to make the resistance of the CdTe single crystal become high resistance, the lifetime of the carrier (electron or electron hole) generated by inputting radiation becomes small. Thereby, there is a problem such that the sensitivity of a radiation detector becomes low. Therefore, a technique for producing a CdTe single crystal whose chlorine concentration is low (not more than 5 ppmwt) and having high resistance (not less than $1.0 \times 10^9$ $\Omega \cdot cm$) has been required.

In order to achieve the above-described object, for example, a technique such that the resistance of a CdTe single crystal is made high by heat-treating a CdTe crystal at a temperature between 350° C. and 450° C. after growing the CdTe crystal in which chlorine is doped by utilizing the THM is disclosed (Japanese Patent Laid-Open Publication No. 5-283729).

Further, since a semiconductor single crystal having a size not less than several mm square is required for producing a semiconductor device, such as a radiation detector or the like, a technique such that a CdTe single crystal having a large particle diameter is grown by utilizing the THM is disclosed (Japanese Patent Laid-Open Publication No. 7-300387 and Japanese Patent No. 2844430).

However, with the technique in the Japanese Patent Laid-Open Publication No. 5-283729, a CdTe single crystal having high resistance can be produced compared with the producing methods of utilizing the THM in the earlier technology, however, it is unable to realize a CdTe single crystal whose chlorine concentration is not more than 5 ppmwt and resistivity not less than $1.0 \times 10^9$ $\Omega \cdot cm$ cannot be realized. Therefore, it cannot say that the above-described CdTe single crystal is most suitable as a semiconductor single crystal for using as a substrate for a semiconductor device, such as a radiation detector or the like, and there is room for improvement.

On the other hand, in the technique of the Japanese Patent Laid-Open Publication No. 7-300387 or Japanese Patent No. 2844430, a technique of attempting to make the particle diameter of the crystal large is disclosed. However, the size of the obtained single crystal is 30 mm at most.

Further, generally, in the growth of single crystal according to the THM, the growth rate is extremely slow as approximately 5 mm per day, so that there is a disadvantage that its production efficiency is bad compared with the VGF method or the like.

Thus, with the methods for producing a CdTe single crystal by the THM in the earlier technology, it is difficult to produce a CdTe single crystal having high purity and high resistance with sufficient productivity.

An object of the present invention is to provide a CdTe single crystal having high purity and high resistance (not less than $1.0 \times 10^9$ $\Omega \cdot cm$) and a CdTe polycrystal which is most suitable as a raw material of the above-described CdTe single crystal, and to provide a method for producing a CdTe single crystal excellent in productivity.

DISCLOSURE OF THE INVENTION

Hereinafter, the background to reach completion of the present invention will be explained briefly.

At first, the inventors considered that it is difficult to improve the productivity according to the THM, so that the inventors decided to utilize a crystal growth method different from the THM (for example, the VGF method).

Then, an experiment of growing CdTe single crystals according to the VGF method by using CdTe polycrystals in which different amount of chlorine was doped (for example, between 100 and 500 ppmwt) as a raw material, and measuring each chlorine concentration and resistivity with respect to the obtained single crystals was carried out.

The results are shown by the black-filled square (■), black-filled triangle (▲), cross (×) and black-filled lozenge (♦) marks in FIG. 3. The black-filled square marks in the figure relate to the CdTe single crystal produced by using a CdTe polycrystal whose chlorine-doping amount at the time of crystal growth is 100 ppmwt as a raw material. The black-filled triangle marks in the figure relate to the CdTe single crystal produced by using a CdTe polycrystal whose chlorine-doping amount is 150 ppmwt as a raw material. The cross marks in the figure relate to the CdTe single crystal produced by using a CdTe polycrystal whose chlorine-doping amount is 200 ppmwt as a raw material. The black-filled lozenge marks in the figure relate to the CdTe single crystal produced by using a CdTe polycrystal whose chlorine-doping amount is 500 ppmwt as a raw material.

According to FIG. 3, it is recognized that the chlorine concentration of the CdTe single crystal becomes not more than 10 ppmwt when the chlorine-doping amount of the CdTe polycrystal as a raw material is up to 200 ppmwt. Further, the resistivity becomes large with the chlorine concentration in the CdTe single crystal becoming large. However, it is recognized that a CdTe single crystal having high resistance of not less than $1.0 \times 10^9$ Ω·cm cannot be realized.

Further, when the chlorine-doping amount of the CdTe polycrystal as a raw material is 500 ppmwt (the black-filled lozenge marks in the figure), the resistivity becomes comparatively high of not less than $9.0 \times 10^8$ Ω·cm. However, the chlorine concentration of the CdTe single crystal at that time becomes not less than 10 ppmwt, so that it is unsuitable for use of a substrate for a semiconductor device.

As above, in a first experiment, a CdTe single crystal whose chlorine concentration is not more than 5 ppmwt and having high resistance of not less than $1.0 \times 10^9$ Ω·cm could not be obtained.

Next, the inventors focused on the CdTe polycrystal which becomes a raw material of a CdTe single crystal. Then, the inventors studied about an apparatus for synthesizing a CdTe polycrystal with reference to the Japanese Patent No. 2517803. Concretely, a CdTe polycrystal is synthesized by the apparatus shown in FIG. 1. The inventors studied about the case that a container made of pBN is used as an inner container 4a. In addition, in the above-described first experiment, a container made of quartz was used as the inner container 4a.

A CdTe polycrystal is synthesized by using a container made of pBN as the inner container 4a. The measured results of the chlorine concentration and resistivity (room temperature) with respect to the CdTe single crystal produced by using the obtained CdTe polycrystal as a raw material are shown by white circle (○) marks in FIG. 3. Here, the chlorine-doping amount in the CdTe polycrystal used as a raw material is 200 ppmwt.

According to FIG. 3, it is recognized that the chlorine concentration in the CdTe single crystal becomes approximately in the vicinity of 5 ppmwt and the resistivity becomes not less than $1.0 \times 10^9$ Ω·cm when a CdTe polycrystal is synthesized by using an inner container made of pBN and a CdTe single crystal is produced by using this CdTe polycrystal as a raw material.

Thereby, the inventors have become convinced that the material of the sealed container (inner container 4a) at the time of synthesizing a CdTe polycrystal affects the resistivity of a CdTe single crystal using the CdTe polycrystal as a raw material, and have found that the resistivity of a CdTe single crystal can be made high without doping excess chlorine by which uses pBN as the material of the container.

The present invention was made in view of the above-described finding. It is a CdTe single crystal, wherein chlorine concentration in the crystal is between 0.1 and 5.0 ppmwt and resistivity at room temperature is not less than $1.0 \times 10^9$ Ω·cm. Further, with the CdTe single crystal, a diameter of a grown single crystal ingot may be not less than 50 mm, preferably, not less than 75 mm, more preferably, not less than 100 mm.

As for the above-described CdTe single crystal, since making the resistance high without doping excess chlorine is realized, it is most suitable as a substrate for a semiconductor device used in a radiation detector or the like.

Further, the above-described CdTe single crystal can be realized by producing it according to one of a vertical gradient freezing method, a horizontal gradient freezing method, a vertical Bridgman method, a horizontal Bridgman method, and a liquid encapsulated Czochralski method by using a CdTe polycrystal as a raw material, the CdTe polycrystal being produced by doping 50 to 200 ppmwt of chlorine in a CdTe polycrystal which shows an n-type electric property of carrier concentration being not more than $1.0 \times 10^{15}$ cm$^{-3}$ or a p-type electric property of carrier concentration being not more than $1.0 \times 10^{14}$ cm$^{-3}$ in a state without doping the chlorine.

Further, the CdTe polycrystal is made to grow by disposing Cd having purity of not less than 99.9999 wt %, Te having purity of not less than 99.9999 wt %, and cadmium chloride having purity of not less than 99.99 wt % as raw materials in a half-sealed type inner container made of pBN; putting the inner container made of pBN into a heat resistant outer container and vacuum-sealing the outer container; carrying out synthetic reaction by melting the raw materials in the inner container made of pBN by heating the outer container containing the inner container with a heating device to increase temperature; and thereafter, growing the crystal by decreasing gradually a temperature of the melted raw materials.

BEST MODE FOR CARRYING OUT THE INVENTION

Hereinafter, a preferred embodiment of the present invention will be explained on the basis of the drawings.

Figure 1:
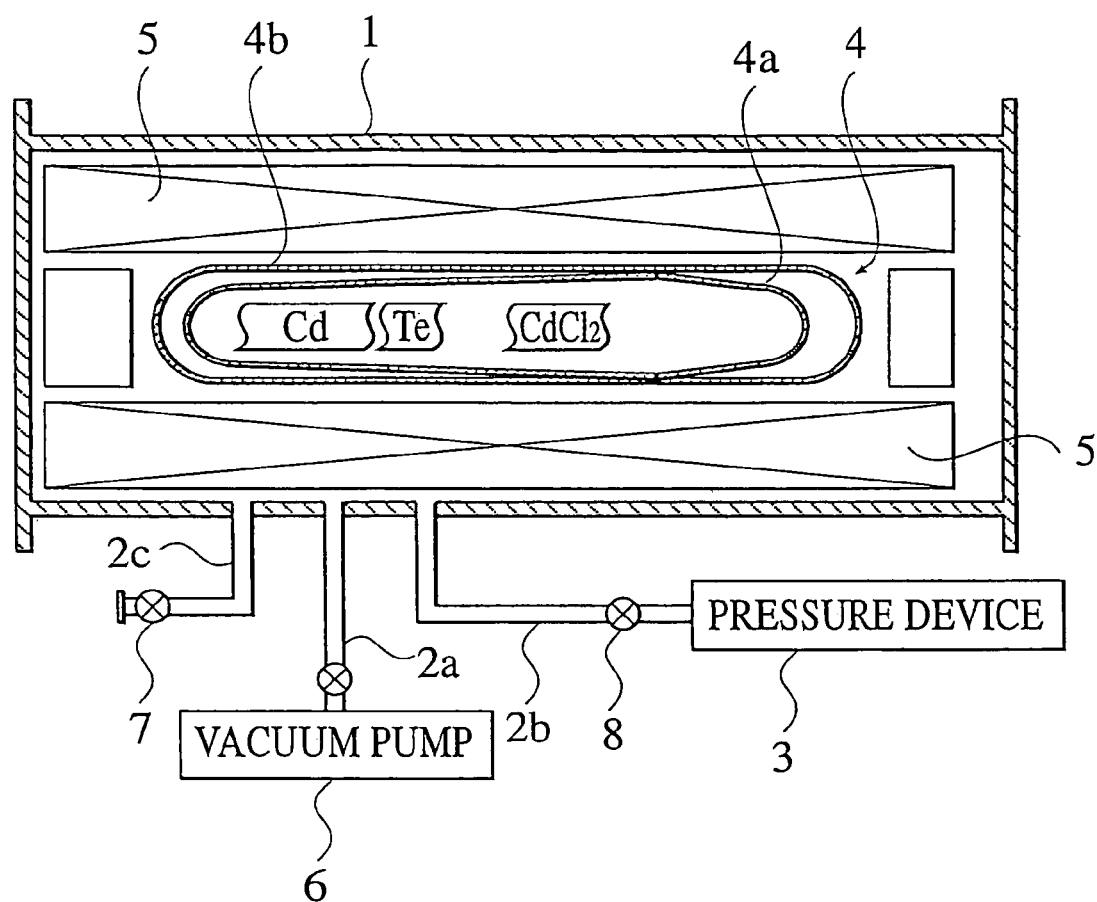
FIG. 1 is a view schematically showing a construction of a crystal growth apparatus used for synthesis of a CdTe polycrystal of an embodiment of the present invention.

At first, a method for synthesizing a CdTe polycrystal by using an apparatus in FIG. 1 will be explained. FIG. 1 is a view schematically showing a construction of the apparatus used for synthesis of the CdTe polycrystal of the embodiment.

In FIG. 1, the reference numeral 1 is a high pressure container. A vacuum pump 6 is connected to the high pressure container 1 through a pipe 2a, and a pressure device 3 is connected to the same through a pipe 2b. After discharging air in the high pressure container 1 by the vacuum pump 6, $N_2$ gas or the like is put into the high pressure container 1 by the pipe 2b so as to substitute the internal gas. The $N_2$ gas or the like is further pressed into the high pressure container 1 by the pressure device 3 so as to make it possible to adjust the pressure in the high pressure container 1.

Further, a third pipe 2c is connected to the high pressure container 1. The gas pressed into the furnace can be discharged by opening a valve 7 provided in the middle of the pipe 2c.

It can be considered that as the above-described pressure device 3, for example, a high pressure gas cylinder is used, and the pressure of the gas therein is reduced by a reducing valve. Then, the pressure-reduced gas is supplied into the high pressure container 1 through a pressure controller 8 so as to set at a desired pressure.

Further, in the crystal growth apparatus in the embodiment, a synthesis container 4 having a double structure of an inner container 4a made of pBN at the center of the above-described high pressure container 1 and an outer container 4b made of quartz is disposed, and a heater 5 is provided so as to surround the synthesis container 4.

In addition, the structure of the inner container 4a is not limited particularly, but it has a tea caddy-like structure in the embodiment. That is, the inner container 4a comprises a cylindrical body, an end thereof being closed and the other end thereof being open; and a cylindrical cover comprising an opening portion having an inner diameter the same as or slightly larger than the outer diameter of the opening end of the cylindrical body. The container can be sealed when the cover is made to fit in the opening end of the body.

In the embodiment, a CdTe polycrystal was synthesized by using the apparatus in FIG. 1.

At first, 717.4 g of Cd having purity of not less than 6N (99.9999 wt %), similarly, 811.4 g of Te having purity of not less than 6N, and 0.789 g of cadmium chloride having purity of not less than 4N (99.99 wt %) were put into the cylindrical body of the inner container 4a, and the body was covered with the cylindrical cover.

Next, the inner container 4a was put into the outer container 4b, and they were sealed by an oxyhydrogen burner after vacuum pumping the inside of the outer container 4b to $2.5 \times 10^{-7}$ Torr.

Then, after the double sealed container 4 was contained in the high pressure container 1, $N_2$ gas having a pressure of 2.0 kg/cm² G was supplied into the high pressure container 1 by the pressure device 3, and at the same time, the sealed container 4 was heated to increase the temperature by the heater 5.

Next, at the time that the temperature in the high pressure container 1 exceeded the melting point of Te (for example, 600° C.) or at the time of detecting the temperature in the container increasing rapidly, the power supply to the heater 5 was lowered, and the container 1 was pressurized to make the pressure in the high pressure container 1 become 4 kg/cm² G.

Next, at the time that the synthetic reaction was settled temporarily and the temperature was decreased gradually, the container 4 was heated to increase the temperature by the heater 5 again. The temperature of the sealed container 4 was increased to not less than 1092° C., which is the melting point of CdTe, and the compound in the container was melted completely. Then, in order to make the composition uniform, the temperature of the sealed container 4 was kept in the vicinity of 1100 to 1130° C. for one hour.

Thereafter, the pressure in the high pressure container 1 was reduced to 2.0 kg/cm² G and the power supply to the heater 5 was stopped so as to cool the temperature to room temperature.

Figure 2:
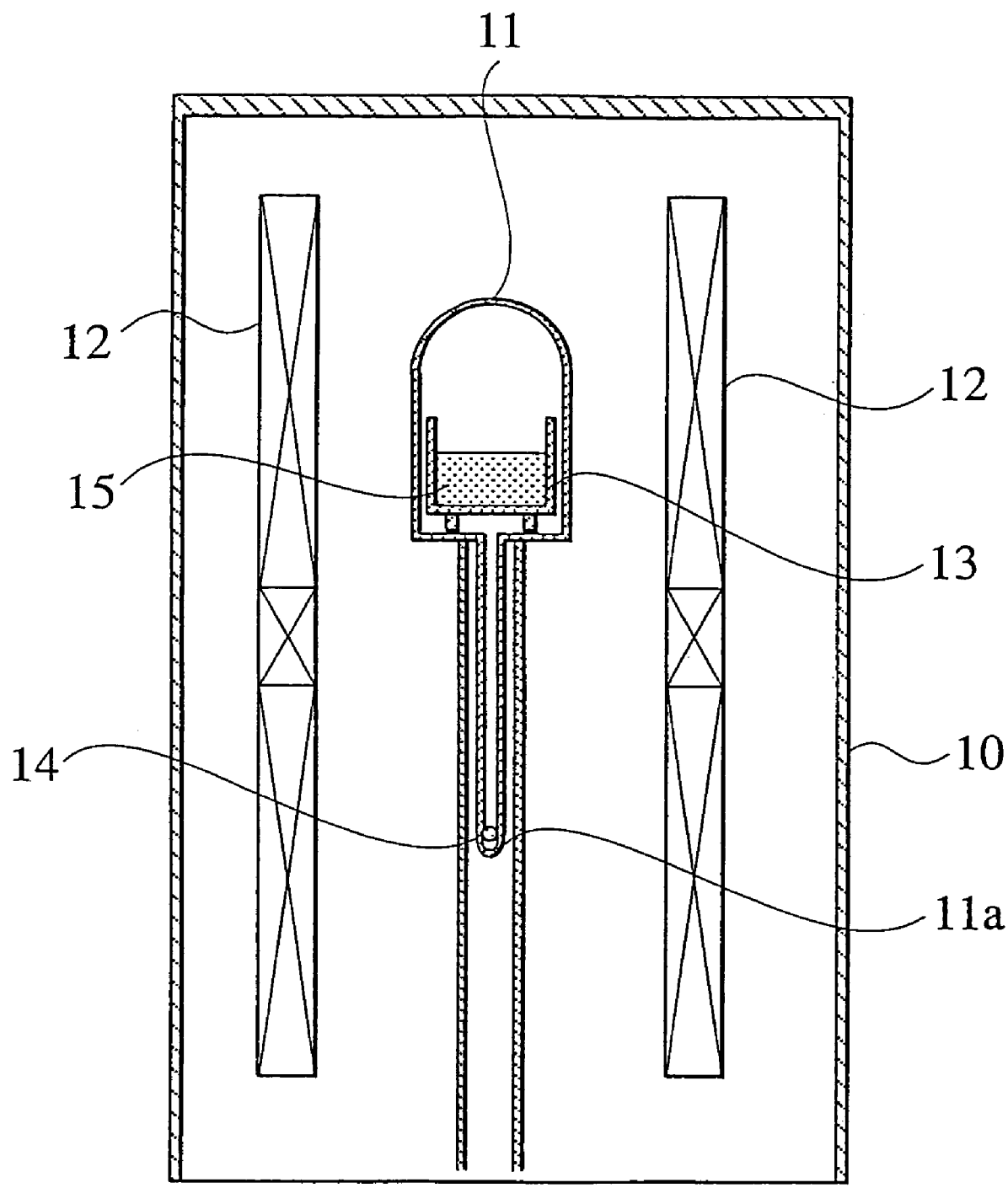
FIG. 2 is a view schematically showing a construction of a crystal growth apparatus for growing a CdTe single crystal of the embodiment according to the VGF method.
Figure 3:
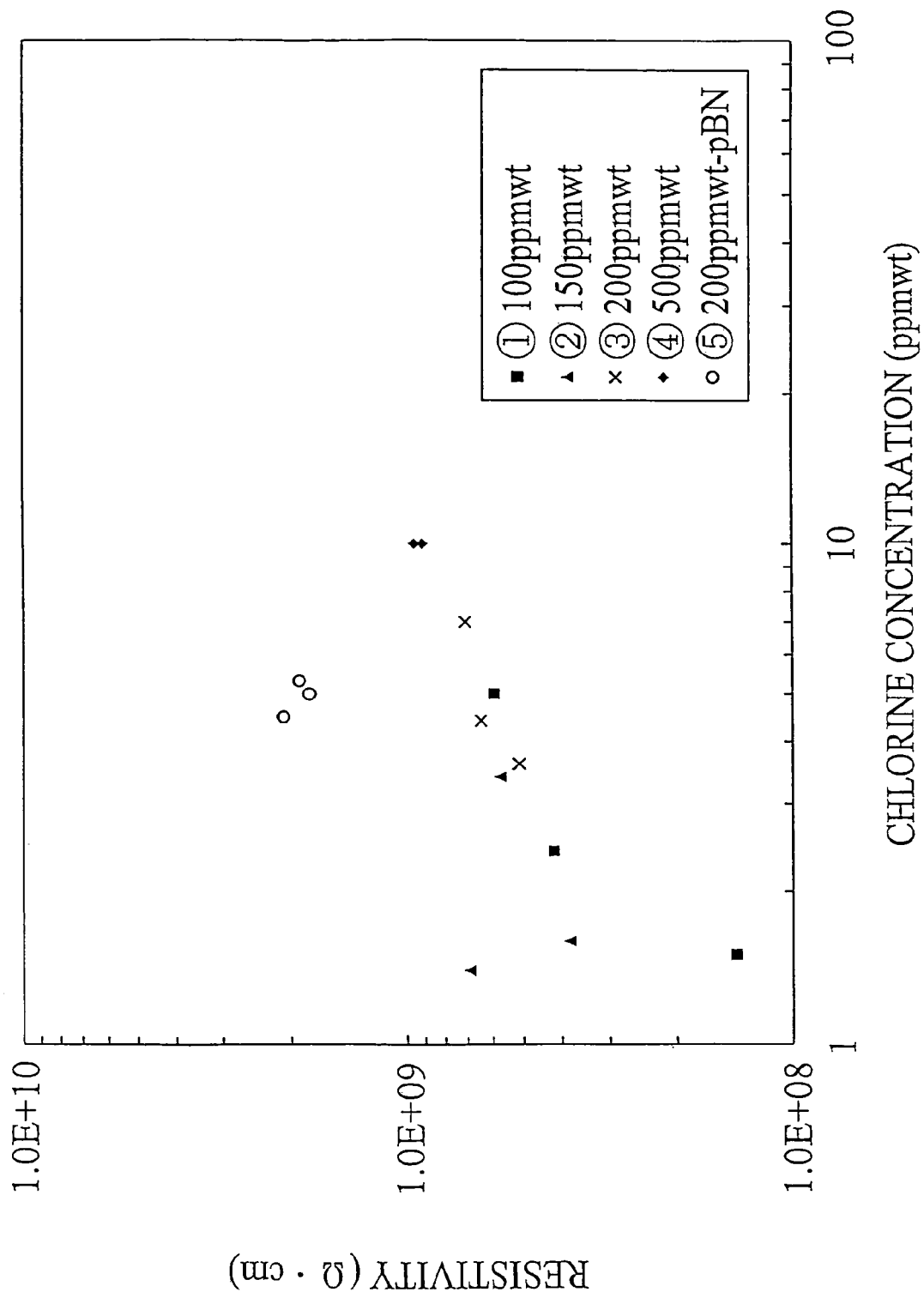
FIG. 3 is a graph showing a relationship between chlorine concentration and resistivity of CdTe single crystals.

Next, a method for growing a CdTe single crystal by using the CdTe polycrystal obtained by the above-mentioned producing method as a raw material will be explained. FIG. 2 is a view schematically showing a crystal growth apparatus for growing a CdTe single crystal of the embodiment by the VGF method.

In FIG. 2, the reference numeral 10 is a high pressure container. A quartz ampoule 11 having a reservoir portion 11a is disposed in the center of the high pressure container 10. Further, a crucible 13 made of pBN is disposed in the quartz ampoule 11, and a heater 12 is provided so as to surround the quartz ampoule 11. In addition, the structure of the heater 12 is not limited particularly, but it is desirable to have a structure such that the portion corresponding to the crucible 13 and the portion corresponding the reservoir portion 11a can be heated to different temperature, and that the temperature distribution in the high pressure container 10 can be controlled minutely, for example, a multistage type structure of three stages, as in the embodiment.

At first, 10 g of a Cd simple substance 14, which is an easily volatile element, was put into the reservoir portion 11a of the quartz ampoule 11, and the quartz ampoule 11 was vacuum-sealed after a CdTe raw material 15 was put into the crucible 13 made of pBN to be disposed in the quartz ampoule 11. At this time, the block-like split CdTe polycrystal obtained by the above-mentioned method and a granular ZnTe lump were used as the CdTe raw material.

Then, it was heated to increase the temperature by the heater 12, and the CdTe raw material 15 in the crucible 13 was melted. The reservoir portion 11a was heated to a predetermined temperature, for instance, between 770 and 830° C., by the heater 12 to perform vapor pressure control, and the crucible 13 was heated.

Moreover, power supplied to each heater was controlled by a control device (not shown) so as to generate a desired temperature distribution in the high pressure container 10, and the temperature in the heating furnace was decreased gradually so as to make a CdTe single crystal grow from the surface of the raw material melt toward the lower portion of the melt. Then, the crystal was grown for 250 hours at a growth rate of 4 mm/hr, and thereby, a CdTe single crystal ingot having a diameter of 78 mm and a length of 60 mm was obtained.

Next, chlorine concentration and resistivity (room temperature) in three portions of upper portion, middle portion and lower portion of the CdTe single crystal ingot obtained by the above-mentioned producing method were measured.

The measured results are shown in Table 1. As shown in Table 1, in the upper portion of the CdTe single crystal ingot, the chlorine concentration was 4.5 ppmwt and the resistivity was $2.1 \times 10^9$ Ω·cm. In the middle portion, the chlorine concentration was 5.0 ppmwt and the resistivity was $1.8 \times 10^9$ Ω·cm. In the lower portion, the chlorine concentration was 5.3 ppmwt and the resistivity was $1.9 \times 10^9$ Ω·cm.

That is, according to the producing method of the embodiment, a CdTe single crystal whose chlorine concentration is approximately 5 ppmwt and having a resistivity of not less than $1.0 \times 10^9$ Ω·cm was able to be obtained.

TABLE 1

| SAMPLE No. | MEASURED PORTION | CHLORINE CONCENTRATION (ppmwt) | RESISTIVITY (Ω · cm) |
|---|---|---|---|
| 1 | UPPER | 4.5 | $2.1 \times 10^9$ |
|   | MIDDLE | 5.0 | $1.8 \times 10^9$ |
|   | LOWER | 5.3 | $1.9 \times 10^9$ |

Next, as a comparative example, about a CdTe single crystal produced by using a CdTe polycrystal, which is obtained by using an inner container 4a (FIG. 1) made of quartz, as a raw material will be explained. In addition, the producing conditions other than changing the material of the inner container 4a were the same as the above-described embodiment.

According to the above-mentioned method, a CdTe single crystal ingot having a diameter of 75 mm and a length of 40 mm was obtained.

The measured results of chlorine concentration and resistivity (room temperature) of this CdTe single crystal ingot are shown in Table 2. As shown in Table 2, in the upper portion of the CdTe single crystal ingot, the chlorine concentration was 3.6 ppmwt and the resistivity was $5.1 \times 10^8$ Ω·cm. In the middle portion, the chlorine concentration was 4.4 ppmwt and the resistivity was $6.4 \times 10^8$ Ω·cm. In the lower portion, the chlorine concentration was 7.0 ppmwt and the resistivity was $7.1 \times 10^8$ Ω·cm.

That is, in the producing method of the comparative example, a CdTe single crystal whose chlorine concentration is approximately 5 ppmwt and having resistivity of not less than $1.0 \times 10^9$ Ω·cm was unable to be obtained.

TABLE 2

| SAMPLE No. | MEASURED PORTION | CHLORINE CONCENTRATION (ppmwt) | RESISTIVITY (Ω·cm) |
| --- | --- | --- | --- |
| 2 | UPPER | 3.6 | $5.1 \times 10^8$ |
|  | MIDDLE | 4.4 | $6.4 \times 10^8$ |
|  | LOWER | 7.0 | $7.1 \times 10^8$ |

That is, it was able to realize a CdTe single crystal having high resistance without doping excess chlorine by making an inner container 4a to dispose the raw materials (Cd, Te and $CdCl_2$) be made of pBN when synthesizing a CdTe polycrystal.

In the above, the present invention made by the inventors is explained concretely on the basis of the embodiment. However, the present invention is not limited to the above-described embodiment, but various modifications are possible in a range within the scope of the present invention.

For example, in the above-described embodiment, a method for growing a CdTe single crystal by utilizing the VGF method is explained. However, similarly, a CdTe single crystal having high resistance can be produced with sufficient productivity without doping excess chlorine according to a horizontal gradient freezing method, a vertical Bridgman method, a horizontal Bridgman method, or a liquid encapsulated Czochralski method. In this regard, the VGF method excellent in single crystallization rate is most preferable.

Further, in the above-described embodiment, the case that the chlorine concentration in the CdTe polycrystal is made to be 200 ppmwt is explained. However, the chlorine concentration in a CdTe single crystal to be produced can be controlled to not more than 5 ppmwt by using a CdTe polycrystal whose chlorine concentration is between 50 and 200 ppmwt as a raw material.

According to the present invention, a CdTe single crystal having high resistance and high purity, the chlorine concentration in the crystal being between 0.1 and 5.0 ppmwt and the resistivity at room temperature being not less than $1.0 \times 10^9$ Ω·cm, can be realized.

Further, the production efficiency of the CdTe single crystal can be improved dramatically by producing a CdTe single crystal according to one of a vertical gradient freezing method, a horizontal gradient freezing method, a vertical Bridgman method, a horizontal Bridgman method, and a liquid encapsulated Czochralski method by using a CdTe polycrystal in which 50 to 200 ppmwt of chlorine is doped as a raw material.

INDUSTRIAL APPLICABILITY

The CdTe single crystal having high resistance, which is produced by applying the present invention, can be utilized as a substrate for a semiconductor device, such as a high-performance radiation detector or the like.

The invention claimed is:

1. A method for producing a CdTe single crystal, wherein the CdTe single crystal has a chlorine concentration between 0.1 and 1.0 ppmwt in the crystal and has a resistivity at room temperature of not less than $1.0 \times 10^9$ Ω·cm, and the CdTe single crystal is obtained according to any one of a vertical gradient freezing method, a horizontal gradient freezing method, a vertical Bridgman method, a horizontal Bridgman method, and a liquid encapsulated Czochralski method, by using as a raw material a CdTe polycrystal which is produced by doping 50 to 200 ppmwt of chlorine in a CdTe polycrystal which shows an n-type electric property of carrier concentration being not more than $1.0 \times 10^{15}$ cm$^{-3}$ or a p-type electric property of carrier concentration being not more than $1.0 \times 10^{14}$ cm$^{-3}$ in a state without doping the chlorine.

2. A method for producing a CdTe single crystal, comprising:

disposing a raw material which comprises Cd having a purity of not less than 99.9999 wt %, Te having a purity of not less than 99.9999 wt %, and cadmium chloride having a purity of not less than 99.99 wt % in a half-sealed inner container made of pBN;

vacuum-sealing a heat resistant outer container after putting the inner container made of pBN into the outer container;

carrying out synthetic reaction by melting the raw materials in the inner container made of pBN by heating the outer container containing the inner container with a heating device to increase temperature; and thereafter, obtaining a CdTe single crystal having a chlorine concentration between 0.1 and 1.0 ppmwt in the crystal and having a resistivity of not less than $1.0 \times 10^9$ Ω·cm at room temperature according to any one of a vertical gradient freezing method, a horizontal gradient freezing method, a vertical Bridgman method, a horizontal Bridgman method, and a liquid encapsulated Czochralski method, by using as a raw material a CdTe polycrystal which has a chlorine concentration between 50 and 200 ppmwt in the crystal and which is grown by decreasing gradually a temperature of the melted raw materials.

* * * * *